United States Patent
Fu et al.

(10) Patent No.: US 8,031,484 B2
(45) Date of Patent: Oct. 4, 2011

(54) IC PACKAGES WITH INTERNAL HEAT DISSIPATION STRUCTURES

(75) Inventors: Huili Fu, Hong Kong (CN); Man Lung Sham, Hong Kong (CN); Chang-Hwa Chung, Hong Kong (CN)

(73) Assignee: Hong Kong Applied Science and Technology Research Institute Co., Ltd., Hong Kong (CN)

( * ) Notice: Subject to any disclaimer, the term of this patent is extended or adjusted under 35 U.S.C. 154(b) by 1510 days.

(21) Appl. No.: 11/454,356

(22) Filed: Jun. 16, 2006

(65) Prior Publication Data

US 2007/0291457 A1    Dec. 20, 2007

(51) Int. Cl.
*H05K 7/02* (2006.01)
*H05K 7/04* (2006.01)
(52) U.S. Cl. ............... 361/812; 361/760; 361/767
(58) Field of Classification Search .......... 361/760, 361/767, 812, 780, 792, 794–795; 439/70–73, 439/75; 174/250–262; 257/706, 707, 730, 257/698, 777, 778
See application file for complete search history.

(56) References Cited

U.S. PATENT DOCUMENTS

| | | | |
|---|---|---|---|
| 4,628,407 A | 12/1986 | August et al. | |
| 4,630,172 A | 12/1986 | Stenerson et al. | |
| 4,729,061 A | 3/1988 | Brown | |
| 4,739,448 A | 4/1988 | Rowe et al. | |
| 5,285,352 A | 2/1994 | Pastore et al. | |
| 5,473,813 A * | 12/1995 | Chobot et al. | 29/837 |
| 5,583,377 A | 12/1996 | Higgins, III | |
| 5,772,451 A * | 6/1998 | Dozier et al. | 439/70 |
| 6,396,136 B2 | 5/2002 | Kalidas et al. | |
| 6,507,102 B2 | 1/2003 | Juskey et al. | |
| 6,521,990 B2 | 2/2003 | Roh et al. | |
| 6,711,812 B1 | 3/2004 | Lu et al. | |
| 6,900,535 B2 | 5/2005 | Zhou | |
| 6,954,360 B2 | 10/2005 | Nurminen | |

FOREIGN PATENT DOCUMENTS

| | | |
|---|---|---|
| JP | 7-50489 | 2/1995 |
| JP | 11-121643 | 4/1999 |

OTHER PUBLICATIONS

International Search Report dated Sep. 20, 2007 for PCT/CN2007/070126 in 5 pages.

* cited by examiner

*Primary Examiner* — Hung S Bui
(74) *Attorney, Agent, or Firm* — Fulbright & Jaworski L.L.P.

(57) ABSTRACT

An IC package includes a substrate and a plurality of thermal dissipating vias perforating the substrate. The substrate includes a power plane, a ground plane, and a dielectric layer disposed between the power plane and the ground plane. The power plane includes a power region and a non-power region isolated from each other. The thermal dissipating vias are connected to the non-power regions of the power plane and to the ground plane.

22 Claims, 6 Drawing Sheets

IC PACKAGES WITH INTERNAL HEAT DISSIPATION STRUCTURES

BACKGROUND OF THE INVENTION

1. Field of the Invention

The present application relates to IC packages, and more particularly to IC packages with internal heat dissipation structures.

2. Description of the Related Art

FIG. 1 shows a conventional BGA package 10. The conventional BGA package 10 includes a substrate 2, a plurality of conductive vias perforating the substrate 2, a plurality of external connection terminals such as solder balls, an upper conductive layer 12 formed on the upper surface of the substrate 2, a lower conductive layer 14 formed on the lower surface of the substrate 2, a chip mounting adhesive layer (conductive or non-conductive) 4 on the upper conductive layer 12, and a semiconductor chip 6 attached to the chip mounting adhesive layer 4. The substrate 2 includes a dielectric layer 3, a power plane 8, and a ground plane 11. The semiconductor chip 6 is electrically connected to the upper conductive layer 12 by bonding wires 16.

The conductive vias include a plurality of thermal dissipating vias 18, power vias 20, and signal vias 22 perforating the substrate 2. The solder balls include a plurality of thermal dissipating balls 24, power balls 26, and signal balls 28.

The thermal dissipating balls 24 are connected to the ground plane 11 through thermal dissipating vias 18. The thermal dissipating vias 18 are not connected to the power plane 8. As a result, only the ground plane 11 is part of the direct pathways for dissipating heat in the package 10. The power plane 8 is not part of the pathways for dissipating heat in the package 10.

SUMMARY OF THE INVENTION

An IC package is provided. In one aspect, the IC package includes a substrate and a plurality of thermal dissipating vias, power vias and signal vias perforating the substrate. The substrate includes a power plane, a ground plane, and a dielectric layer disposed between the power plane and the ground plane. The power plane includes a power region and a non-power region isolated from each other. The thermal dissipating vias are connected to the non-power regions of the power plane and to the ground plane. The power vias are connected to the power region of the power plane, but isolated from the non-power region of the power plane and the ground plane. The signal vias are isolated from the power plane and the ground plane The ground plane may include a plurality of via clearance areas. The power vias and signal vias pass through the via clearance areas without being connected to the ground plane. The via clearance areas may be cavities formed in the ground plane.

The power plane may include a plurality of via clearance areas. The signal vias pass through the via clearance areas without being connected to the power plane. The via clearance areas may be cavities formed in the power plane.

In another aspect, the IC package includes a substrate and a plurality of thermal dissipating vias perforating the substrate. The substrate includes a power plane, a ground plane, and a dielectric layer disposed between the power plane and the ground plane. The power plane includes a power region and a non-power region isolated from each other. The thermal dissipating vias are connected to the non-power regions of the power plane and to the ground plane.

The IC package may further include a plurality of power vias perforating the substrate. The power vias is connected to the power region of the power plane, but isolated from the non-power region of the power plane and the ground plane. The ground plane may include a plurality of via clearance areas. The power vias pass through the via clearance areas without being connected to the ground plane. The via clearance areas may be cavities formed in the ground plane.

The IC package may further include a plurality of signal vias perforating the substrate. The signal vias is isolated the power plane and the ground plane. The ground plane may include a plurality of via clearance areas. The signal vias pass through the via clearance areas without being connected to the ground plane. The via clearance areas may be cavities formed in the ground plane. The power plane may include a plurality of via clearance areas. The signal vias pass through the via clearance areas without being connected to the power plane. The via clearance areas may be cavities formed in the power plane.

DETAILED DESCRIPTION OF CERTAIN EMBODIMENTS

Figure 1:
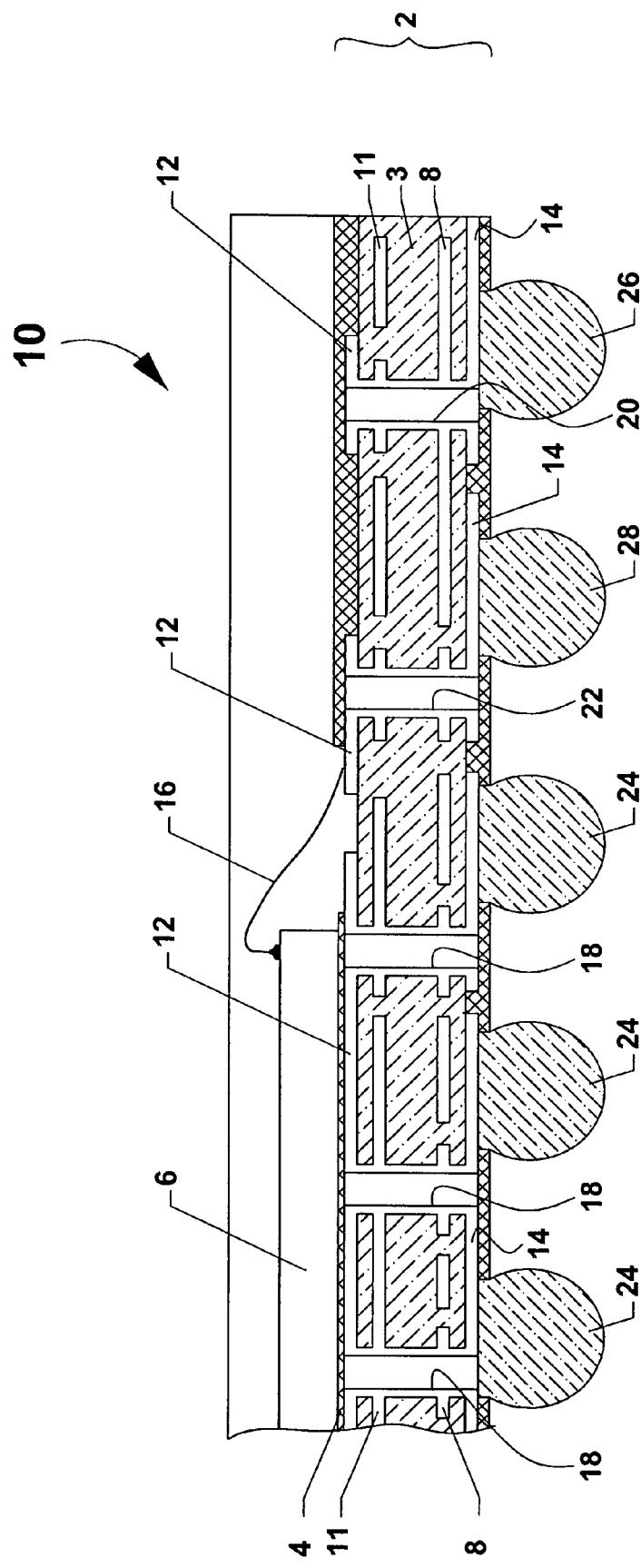
FIG. 1 shows a conventional BGA package.
Figure 2:
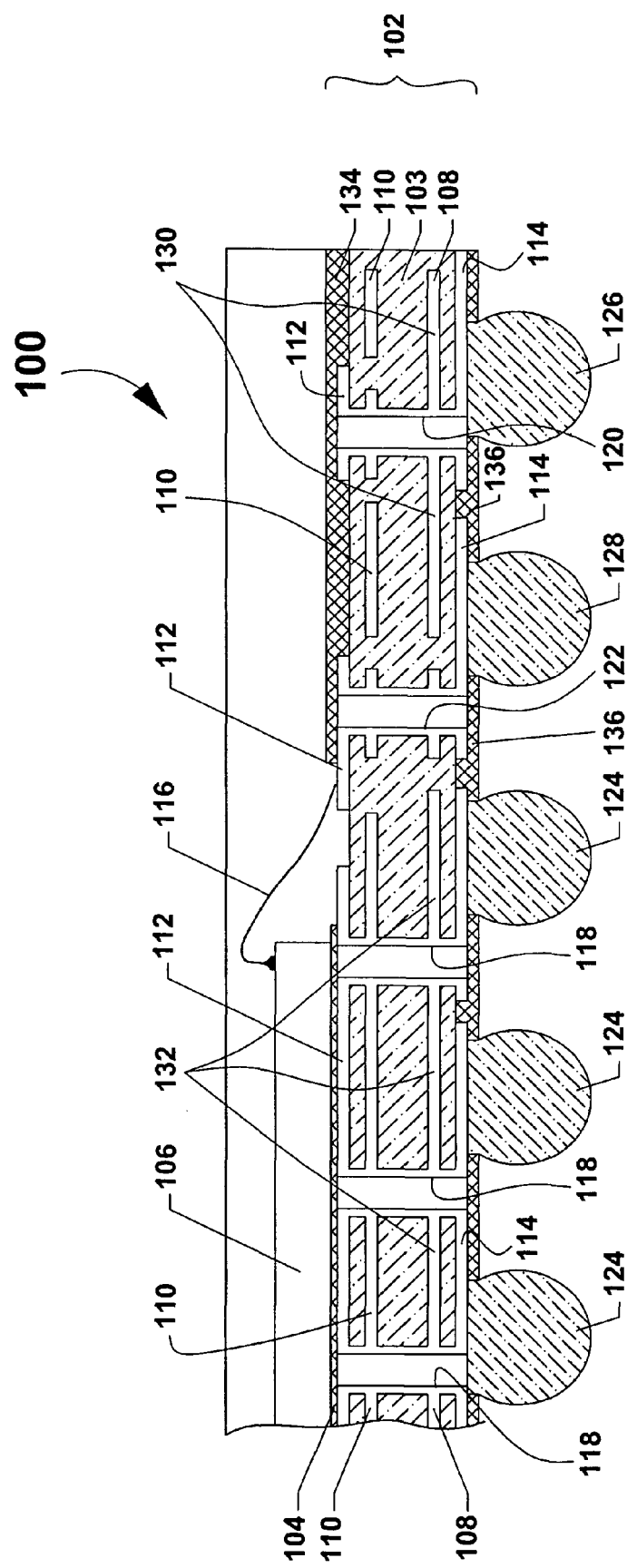
FIG. 2 shows an embodiment of a BGA package having an internal thermal spreader structure.

Referring now to FIG. 2, an embodiment of a BGA package 100 is illustrated. The BGA package 100 includes a substrate 102, a plurality of conductive vias perforating the substrate 102, a plurality of external connection terminals such as solder balls, an upper conductive layer 112 formed on the upper surface of the substrate 102, a lower conductive layer 114 formed on the lower surface of the substrate 102, a chip mounting adhesive layer (conductive or non-conductive) 104 on the upper conductive layer 112, and a semiconductor chip 106 attached to the chip mounting adhesive layer 104. The substrate 102 includes a dielectric layer 103, a power plane 108, and a ground plane 110. The semiconductor chip 106 is electrically connected to the upper conductive layer 112 by bonding wires 116.

An upper solder mask layer 134 is provided over the top surface of the upper conductive layer 112, and lower solder mask layer 136 is provided over the bottom surface of the lower conductive layer 114. The upper solder mask layer 134 includes a plurality of openings which expose areas of the upper conductive layer 112 for the chip 106 to be wire bonded. The lower solder mask layer 136 includes a plurality opens through which the solder balls can be attached to the lower conductive layer 114.

The dielectric layer 103 is formed of insulating material such as glass-epoxy resin or BT resin. The conductive vias include a plurality of thermal dissipating vias 118, power vias 120, and signal vias 122 perforating the substrate 102, which will be discussed in detail below. The solder balls include a plurality of thermal dissipating balls 124, power balls 126, and signal balls 128.

Figure 3:
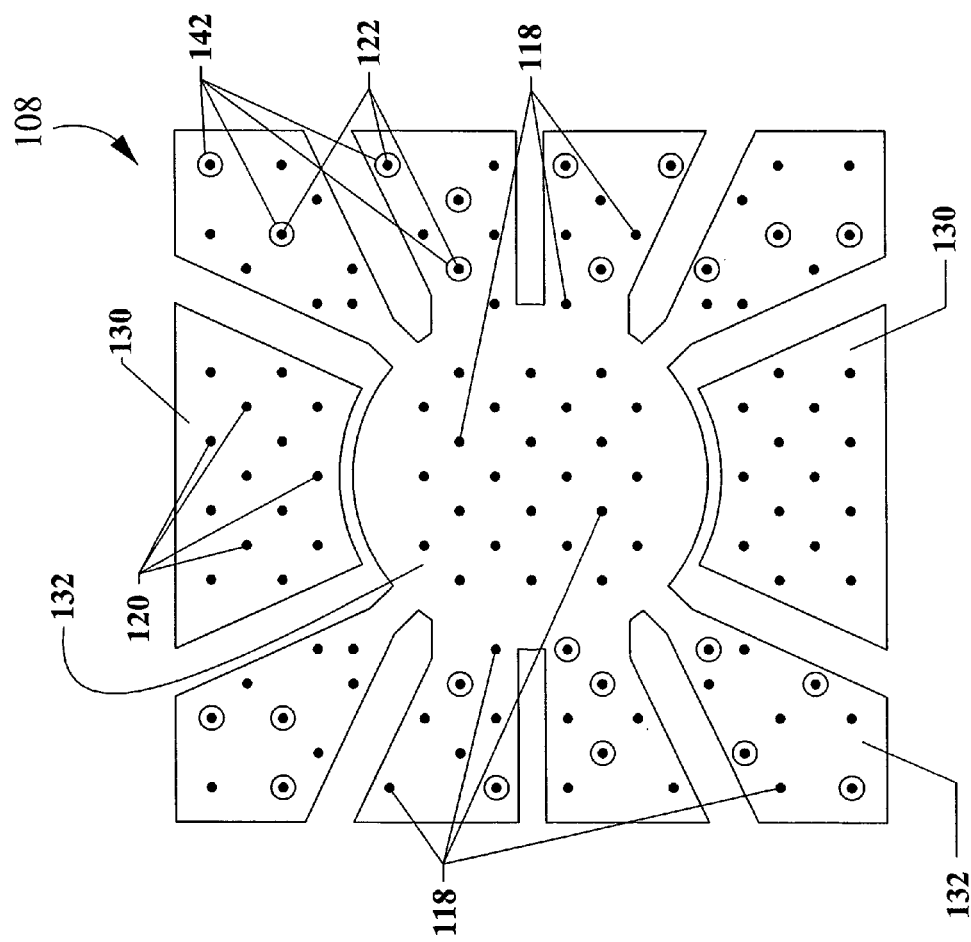
FIG. 3 is a top view of a power plane of the BGA package of FIG. 2.

The power plane 108 and the ground plane 110 are positioned within the substrate 102. In the illustrated embodiment, the power plane 108 and the ground plane 110 are positioned between a plane defined by the upper conductive layer 112 and another plane defined by the lower conductive layer 114. The power plane 108 is made of metal with good conductivity (such as copper). The power plane 108 includes a power region 130 and a non-power region 132. The power region 130 and the non-power region 132 are isolated from each other as shown in FIG. 3. The electrical current passes through only the power region 130 to provide electrical power to the chip 106, but does not pass through the non-power region 132. The ground plane 110 is positioned generally parallel to the power plane 108 and is made of one or more pieces of metal with good conductivity (such as copper) for electrical current drainage.

The thermal dissipating vias 118 provide paths for dissipating heat generated within the BGA package 100. The thermal dissipating vias 118 are connected to the thermal balls 124 through thermal ball pads on the lower conductive layer 114. The thermal dissipating vias 118 are both connected to the non-power region 132 of the power plane 108 and connected to the ground plane 110 to form an internal heat spreader structure. The internal heat spreader structure spreads the heat generated by the semiconductor chip 106 in the center region to the whole package 100. As such, the thermal performance of the package 100 is enhanced. In the illustrated embodiment, the thermal dissipating vias 118 are also connected to the upper conductive layer 112.

Inner walls of the thermal dissipating vias 118 can be plated with metal having good thermal conductivity. Alternatively, in order to improve heat dissipation capacity (heat conduction), the thermal dissipating vias 118 can be filled with metal having good thermal conductivity. The number of thermal dissipating vias 118 is variable, depending on the types of the BGA package.

Figure 4:
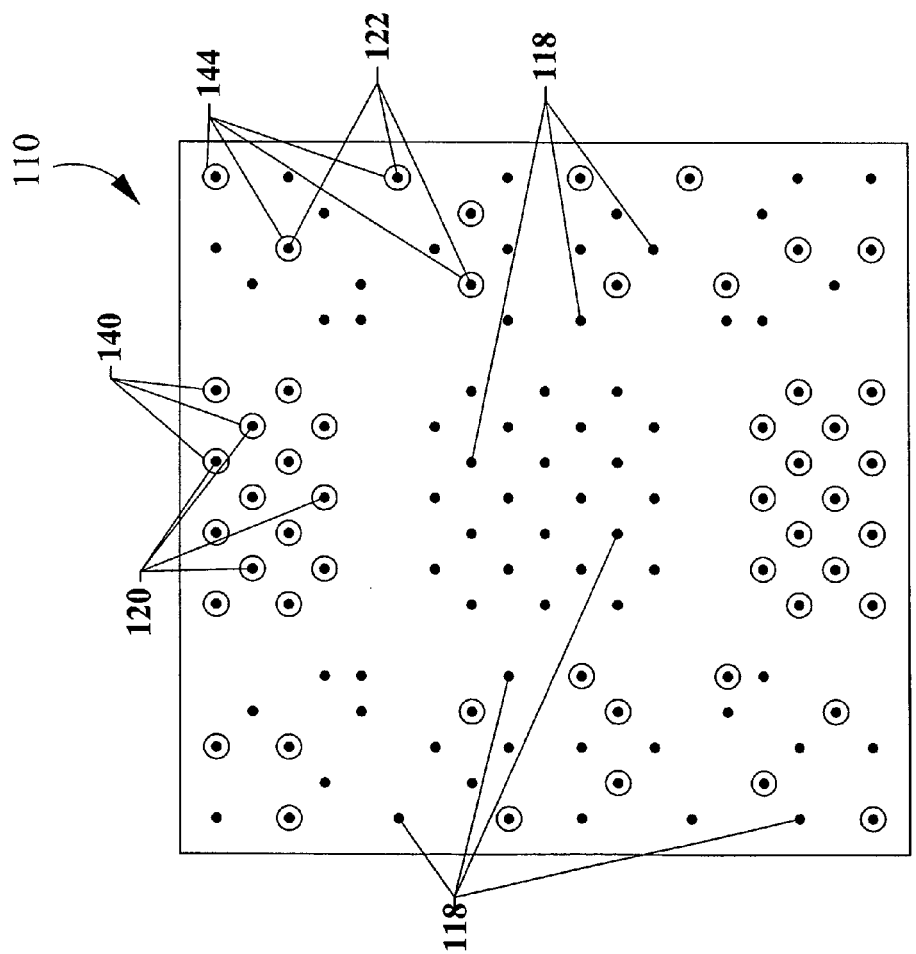
FIG. 4 is a top view of a ground plane of the BGA package of FIG. 2.

The power vias 120 provide pathways for electrical current to power the chip 106. The power vias 120 are connected the power balls 126 through power ball pads on the lower conductive layer 114. The power vias 120 are not connected to the ground plane 110, but connected to the power region 130 of the power plane 108. As shown in FIG. 4, a plurality of via clearance areas 140 can be formed in the ground plane 110, so that the power vias 120 are isolated from the ground plane 110. In the illustrated embodiment, the via clearance areas 140 are cavities formed in the ground plane 110 where the power vias 120 pass through. The dimension of the via clearance areas 140 are slightly larger then the dimension of the power vias 120.

Inner walls of the power vias 120 can be plated with metal having good electrical conductivity, such as copper. Alternatively, the power vias 120 can be filled with metal having good electrical conductivity.

The signal vias 122 provide pathways for signals communicated to and from the chip 106. The signal vias 122 are connected to the chip 106 through bonding wires 116 and bonding pads on the upper conductive layer 112. The signal vias 122 are also connected to the signal balls 128 through signal ball pads on the lower conductive layer 114. The signal vias 122 are neither connected to the ground plane 110, nor connected to the power plane 108. As shown in FIGS. 3 and 4, a plurality of via clearance areas 142 and 144 can be formed in the power plane 108 and the ground plane 110, respectively, so that the signal vias 122 are isolated from the power plane 108 and the ground plane 110. In the illustrated embodiment, the via clearance areas 142 and 144 are cavities formed in the power plane 108 and the ground plane 110 where the signal vias 122 pass through. The dimension of the via clearance areas 142 and 144 are slightly larger then the dimension of the signal vias 122.

Inner walls of the signal vias 122 can be plated with metal having good electrical conductivity, such as copper. Alternatively, the signal vias 122 can be filled with metal having good electrical conductivity.

Figure 5:
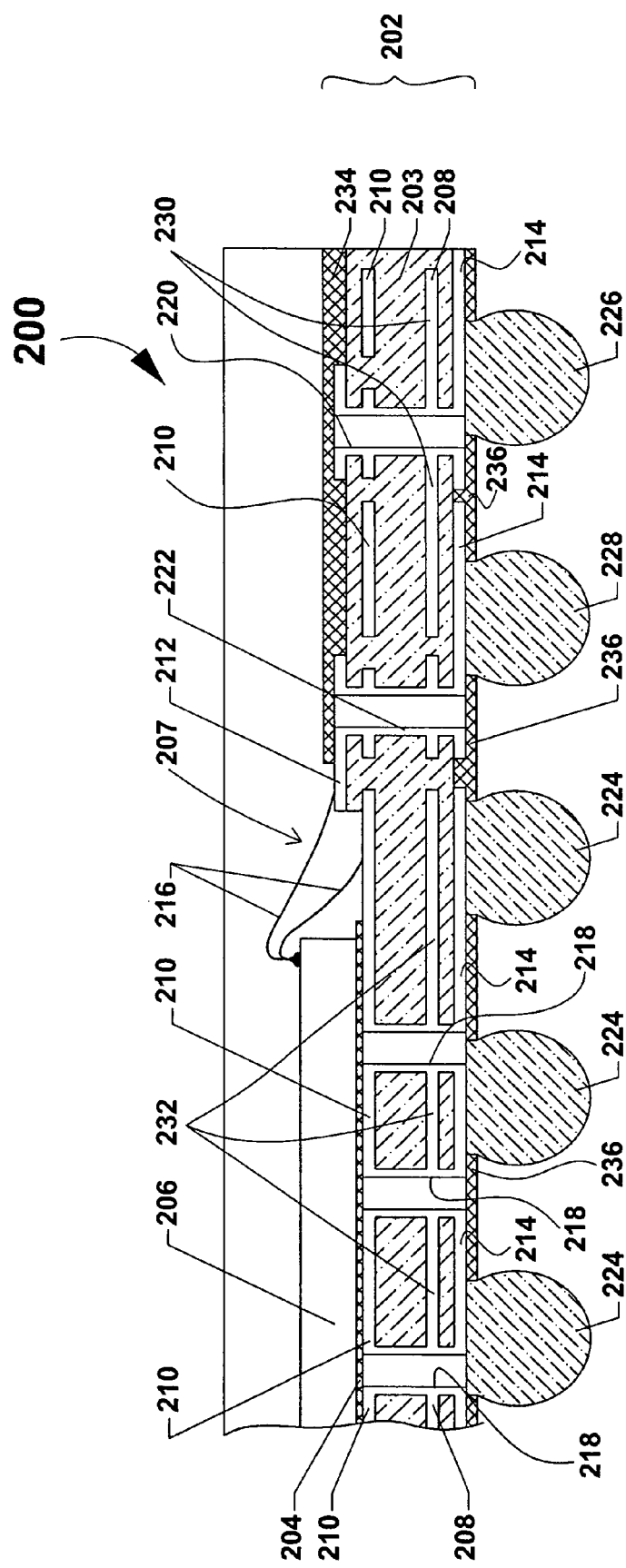
FIG. 5 shows another embodiment of a BGA package having an internal thermal spreader structure.

Referring now to FIG. 5, another embodiment of a BGA package 200 is illustrated. The BGA package 200 includes a substrate 202, a plurality of conductive vias perforating the substrate 202, a plurality of external connection terminals such as solder balls, an upper conductive layer 212 formed on the upper surface of the substrate 202, a lower conductive layer 214 formed on the lower surface of the substrate 202. The substrate 202 includes a dielectric layer 203, a power plane 208, and a ground plane 210.

In the illustrated embodiment, a cavity 207 is created in a center portion of the substrate 202, so that a portion of the ground plane 210 is exposed. A chip mounting adhesive layer (conductive or non-conductive) 204 is formed directly on the exposed portion of the ground plane 210, rather than on the upper conductive layer 212 as shown in FIG. 2. A semiconductor chip 206 is mounted to the chip mounting adhesive layer 204 and is electrically connected to the upper conductive layer 212 and ground layer 210 by bonding wires 216. As such, the profile of the package 200 is reduced as compared to the package 100 in FIG. 2.

An upper solder mask layer 234 is provided over the top surface of the upper conductive layer 212, and lower solder mask layer 236 is provided over the bottom surface of the lower conductive layer 214. The upper solder mask layer 234 includes a plurality of openings which expose areas of the upper conductive layer 212 for the chip 206 to be wire bonded. The lower solder mask layer 236 includes a plurality opens through which the solder balls can be attached to the lower conductive layer 214.

The dielectric layer 203 is formed of insulating material such as glass-epoxy resin or BT resin. The conductive vias include a plurality of thermal dissipating vias 218, power vias 220, and signal vias 222 perforating the substrate 202, which will be discussed in detail below. The solder balls include a plurality of thermal dissipating balls 224, power balls 226, and signal balls 228.

The power plane 208 and the ground plane 210 are positioned within the substrate 202. In the illustrated embodiment, the power plane 208 and the ground plane 210 are positioned between a plane defined by the upper conductive layer 212 and another plane defined by the lower conductive layer 214. The power plane 208 is made of metal with good conductivity (such as copper). The power plane 208 includes a power region 230 and a non-power region 232. The power region 230 and the non-power region 232 are isolated from each other. The electrical current passes through only the power region 230 to provide electrical power to the chip 206, but does not pass through the non-power region 232. The ground plane 210 is positioned generally parallel to the power plane 208 and is made of one or more pieces of metal with good conductivity (such as copper) for electrical current drainage. The detail structure of the power plane and the ground plane can be found in FIG. 3 and FIG. 4, in which reference numerals 108 and 110 represent the power plane 208 and the ground plane 210 in the package 200, respectively.

The thermal dissipating vias 218 provide paths for dissipating heat generated within the BGA package 200. The thermal dissipating vias 218 are connected to the thermal balls 224 through thermal ball pads on the lower conductive layer 214. The thermal dissipating vias 218 are both connected to the non-power region 232 of the power plane 208 and connected to the ground plane 210 to form an internal heat spreader structure. The internal heat spreader structure spreads the heat generated by the semiconductor chip 206 in the center region to the whole package 200. As such, the thermal performance of the package 200 is enhanced. In the illustrated embodiment, since the chip 206 is attached to the ground plane 210, the paths for dissipating heat are shortened as compared to the embodiment in FIG. 2. As such, the heat generated by the chip 206 in the illustrated embodiment can be dissipated more efficiently.

Inner walls of the thermal dissipating vias 218 can be plated with metal having good thermal conductivity. Alternatively, in order to improve heat dissipation capacity (heat conduction), the thermal dissipating vias 218 can be filled with metal having good thermal conductivity. The number of thermal dissipating vias 218 is variable, depending on the types of the BGA package.

The power vias 220 provide pathways for electrical current to power the chip 206. The power vias 220 are connected the power balls 226 through power ball pads on the lower conductive layer 214. The power vias 220 are not connected to the ground plane 210, but connected to the power region 230 of the power plane 208. A plurality of via clearance areas can be formed in the ground plane 210, so that the power vias 220 are isolated from the ground plane 210. In the illustrated embodiment, the via clearance areas are cavities formed in the ground plane 210 where the power vias 220 pass through. The dimension of the via clearance areas are slightly larger then the dimension of the power vias 220.

Inner walls of the power vias 220 can be plated with metal having good electrical conductivity, such as copper. Alternatively, the power vias 220 can be filled with metal having good electrical conductivity.

The signal vias 222 provide pathways for signals communicated to and from the chip 206. The signal vias 222 are connected to the chip 206 through bonding wires 216 and bonding pads on the upper conductive layer 212. The signal vias 222 are also connected to the signal balls 228 through signal ball pads on the lower conductive layer 214. The signal vias 222 are neither connected to the ground plane 210, nor connected to the power plane 208. As shown in FIGS. 3 and 4, a plurality of via clearance areas (similar to reference numerals 142 and 144 in FIGS. 3 and 4) can be formed in the power plane 208 (represented by reference numeral 108 in FIG. 3) and the ground plane 210 (represented by reference numeral 110 in FIG. 4), respectively, so that the signal vias 222 (represented by reference numeral 122 in FIGS. 3 and 4) are isolated from the power plane 208 and the ground plane 210. In the illustrated embodiment, the via clearance areas are cavities formed in the power plane 208 and the ground plane 210 where the signal vias 222 pass through. The dimension of the via clearance areas are slightly larger then the dimension of the signal vias 222.

Inner walls of the signal vias 222 can be plated with metal having good electrical conductivity, such as copper. Alternatively, the signal vias 222 can be filled with metal having good electrical conductivity.

Figure 6:
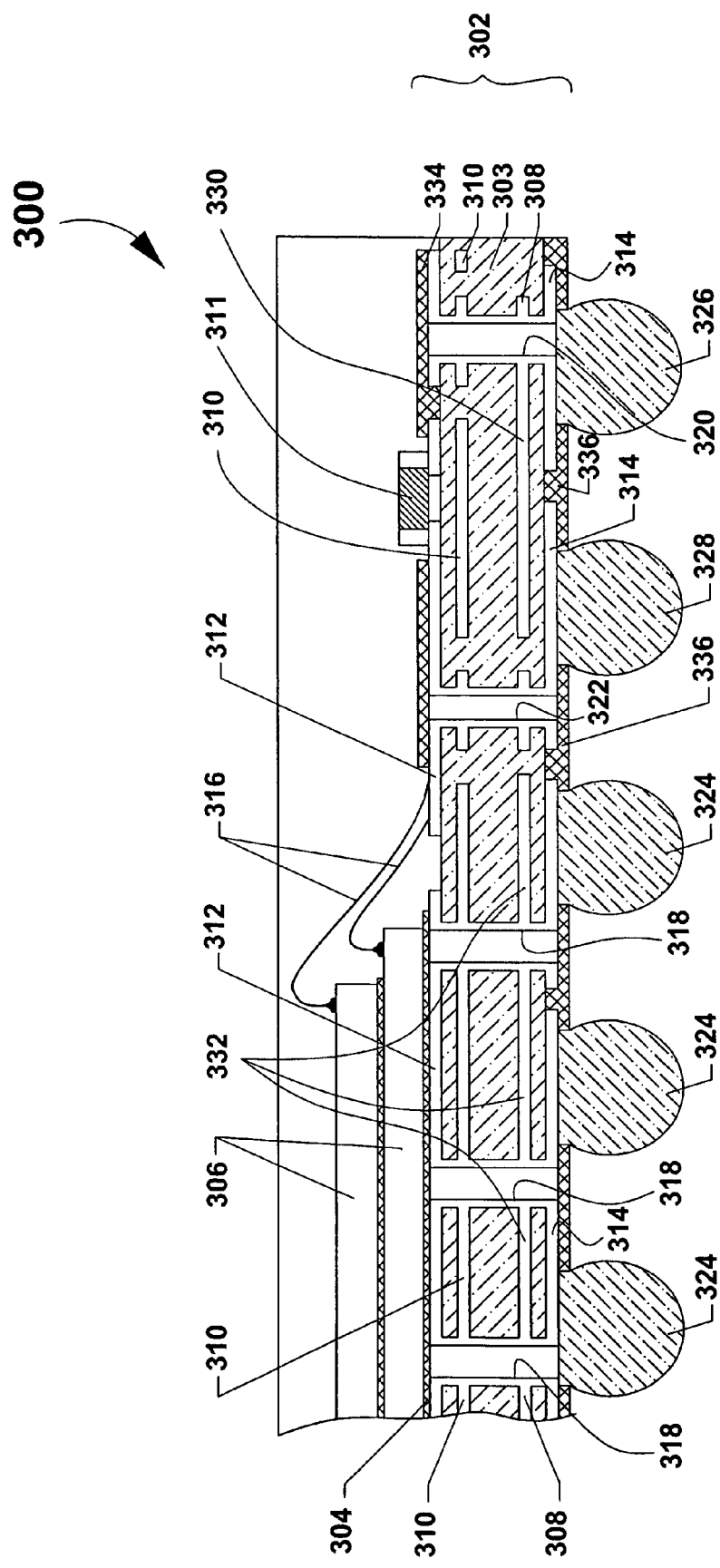
FIG. 6 shows an embodiment of a SiP having an internal thermal spreader structure.

Referring now to FIG. 6, an embodiment of a system-in-package (SiP) 300 is illustrated. The SiP 300 includes a substrate 302, a plurality of conductive vias perforating the substrate 302, a plurality of external connection terminals such as solder balls, an upper conductive layer 312 formed on the upper surface of the substrate 302, a lower conductive layer 314 formed on the lower surface of the substrate 302, a chip mounting adhesive layer (conductive or non-conductive) 304 on the upper conductive layer 312, and multiple stacked semiconductor chips 306 attached to the chip mounting adhesive layer 304. The substrate 302 includes a dielectric layer 303, a power plane 308, and a ground plane 310. The stacked chips 306 are electrically connected to the upper conductive layer 312 by bonding wires 316. A plurality of discrete components 311 are mounted and electrically connected to the upper conductive layer 312.

An upper solder mask layer 334 is provided over the top surface of the upper conductive layer 312, and lower solder mask layer 336 is provided over the bottom surface of the lower conductive layer 314. The upper solder mask layer 334 includes a plurality of openings which expose areas of the upper conductive layer 312 for the stacked chips 306 to be wire bonded. The lower solder mask layer 336 includes a plurality opens through which the solder balls can be attached to the lower conductive layer 314.

The dielectric layer 303 is formed of insulating material such as glass-epoxy resin or BT resin. The conductive vias include a plurality of thermal dissipating vias 318, power vias 320, and signal vias 322 perforating the substrate 302, which will be discussed in detail below. The solder balls include a plurality of thermal dissipating balls 324, power balls 326, and signal balls 328.

The power plane 308 and the ground plane 310 are positioned within the substrate 302. In the illustrated embodiment, the power plane 308 and the ground plane 310 are positioned between a plane defined by the upper conductive layer 312 and another plane defined by the lower conductive layer 314. The power plane 308 is made of metal with good conductivity (such as copper). The power plane 308 includes a power region 330 and a non-power region 332. The power region 330 and the non-power region 332 are isolated from each other. The electrical current passes through only the power region 330 to provide electrical power to the chip 306, but does not pass through the non-power region 332. The ground plane 310 is positioned generally parallel to the power plane 308 and is made of one or more pieces of metal with good conductivity (such as copper) for electrical current drainage. The detail structure of the power plane and the ground plane can be found in FIG. 3 and FIG. 4, in which reference numerals 108 and 110 represent the power plane 208 and the ground plane 310 in the package 00, respectively.

The thermal dissipating vias 318 provide paths for dissipating heat generated within the SiP 300. The thermal dissipating vias 318 are connected to the thermal balls 324 through thermal ball pads on the lower conductive layer 314. The thermal dissipating vias 318 are both connected to the non-power region 332 of the power plane 308 and connected to the ground plane 310 to form an internal heat spreader structure. The internal heat spreader structure spreads the heat generated by the stacked chips 306 concentrated in the center region to the whole SiP 300 package. As such, the thermal performance of the SiP 300 is enhanced. In the illustrated embodiment, the thermal dissipating vias 318 are also connected to the upper conductive layer 312.

Inner walls of the thermal dissipating vias 318 can be plated with metal having good thermal conductivity. Alternatively, in order to improve heat dissipation capacity (heat conduction), the thermal dissipating vias 318 can be filled with metal having good thermal conductivity. The number of thermal dissipating vias 318 is variable, depending on the types of the SiP.

The power vias 320 provide pathways for electrical current to power the stacked chips 306. The power vias 320 are connected the power balls 326 through power ball pads on the lower conductive layer 314. The power vias 320 are not connected to the ground plane 310, but connected to the power region 330 of the power plane 308. A plurality of via clearance areas can be formed in the ground plane 310, so that the power vias 320 are isolated from the ground plane 310. In the illustrated embodiment, the via clearance areas are cavities formed in the ground plane 310 where the power vias 320 pass through. The dimension of the via clearance areas are slightly larger then the dimension of the power vias 320.

Inner walls of the power vias 320 can be plated with metal having good electrical conductivity, such as copper. Alternatively, the power vias 320 can be filled with metal having good electrical conductivity.

The signal vias 322 provide pathways for signals communicated to and from the stacked chips 306. The signal vias 322 are connected to the stacked chips 306 through bonding wires 316 and bonding pads on the upper conductive layer 312. The signal vias 322 are also connected to the signal balls 328 through signal ball pads on the lower conductive layer 314. The signal vias 322 are neither connected to the ground plane 310, nor connected to the power plane 308. A plurality of via clearance areas can be formed in the power plane 308 and the ground plane 310, respectively, so that the signal vias 322 are isolated from the power plane 308 and the ground plane 310. In the illustrated embodiment, the via clearance areas are cavities formed in the power plane 308 and the ground plane 310 where the signal vias 322 pass through. The dimension of the via clearance areas are slightly larger then the dimension of the signal vias 322.

Inner walls of the signal vias 322 can be plated with metal having good electrical conductivity, such as copper. Alternatively, the signal vias 322 can be filled with metal having good electrical conductivity.

Although the embodiments as shown in FIGS. 2-6 are BGA package and SiP, it is to be understood that the internal heat dissipation structures described above can be applied to LGA and other IC packages.

While there have been described and pointed out fundamental novel features of the invention as applied to a preferred embodiment thereof, it will be understood that various omissions and substitutions and changes, in the form and details of the embodiments illustrated, may be made by those skilled in the art without departing from the spirit of the invention. The invention is not limited by the embodiments described above which are presented as examples only but can be modified in various ways within the scope of protection defined by the appended patent claims.

What is claimed is:

1. An IC package comprising:
   a substrate comprising a power plane, a ground plane, and a dielectric layer disposed between the power plane and the ground plane; the power plane comprising a power region and a non-power region isolated from each other;
   a plurality of thermal dissipating vias perforating the substrate, the thermal dissipating vias connected to the non-power region of the power plane and to the ground plane;
   a plurality of power vias perforating the substrate, the power vias connected to the power region of the power plane, but isolated from the non-power region of the power plane and the ground plane; and
   a plurality of signal vias perforating the substrate, the signal vias isolated from the power plane and the ground plane.

2. The IC package of claim 1 further comprising a plurality of thermal balls, wherein the thermal dissipating vias are connected to thermal balls.

3. The IC package of claim 1 further comprising a plurality of power balls, wherein the power vias are connected to the power balls.

4. The IC package of claim 1 further comprising a plurality of signal balls, wherein the signal vias are connected to the signal balls.

5. The IC package of claim 1 wherein:
   the ground plane comprises a plurality of via clearance areas; and
   the power vias and signal vias pass through the via clearance areas without being connected to the ground plane.

6. The IC package of claim 5 wherein the via clearance areas are cavities formed in the ground plane.

7. The IC package of claim 1 wherein:
   the power plane comprises a plurality of via clearance areas; and
   the signal vias pass through the via clearance areas without being connected to the power plane.

8. The IC package of claim 7 wherein the via clearance areas are cavities formed in the power plane.

9. The IC package of claim 1 further comprising:
   an upper conductive layer formed on an upper surface of the substrate; and
   at least one semiconductor chip disposed on the upper conductive layer.

10. The IC package of claim 9 wherein the non-power region, in conjunction with the thermal dissipating vias and the ground plane, is adapted to dissipate heat generated by the at least one semiconductor chip.

11. The IC package of claim 1 further comprising at least one semiconductor chip, wherein a portion of the ground plane is exposed and the semiconductor chip is disposed on the exposed ground plane.

12. The IC package of claim 1 further comprising a lower conductive layer formed on a lower surface of the substrate.

13. The IC package of claim 1 wherein the power plane is adapted so that, in operation, there is no current flow through the non-power region of the power plane and there is current flow through the power region of the power plane.

14. An IC package comprising:
   a substrate comprising a power plane, a ground plane, and a dielectric layer disposed between the power plane and the ground plane; the power plane comprising a power region and a non-power region isolated from each other;
   a plurality of thermal dissipating vias perforating the substrate, the thermal dissipating vias connected to the non-power region of the power plane and to the ground plane;
   a plurality of power vias perforating the substrate, wherein the power vias are connected to the power region of the power plane, but isolated from the non-power region of the power plane and the ground plane; and
   a plurality of signal vias perforating the substrate, wherein the signal vias are isolated from the power plane and the ground plane.

15. The IC package of claim 14 wherein:
   the ground plane comprises a plurality of via clearance areas; and
   the power vias pass through the via clearance areas without being connected to the ground plane.

16. The IC package of claim 15 wherein the via clearance areas are cavities formed in the ground plane.

17. The IC package of claim 14 wherein:
   the ground plane comprises a plurality of via clearance areas; and
   the signal vias pass through the via clearance areas without being connected to the ground plane.

18. The IC package of claim 17 wherein the via clearance areas are cavities formed in the ground plane.

19. The IC package of claim 14 wherein:
   the power plane comprises a plurality of via clearance areas; and
   the signal vias pass through the via clearance areas without being connected to the power plane.

20. The IC package of claim 19 wherein the via clearance areas are cavities formed in the power plane.

21. The IC package of claim 14 further comprising:
a semiconductor chip, wherein the non-power region, in conjunction with the thermal dissipating vias and the ground plane, is adapted to dissipate heat generated by the semiconductor chip.

22. The IC package of claim 14 wherein the power plane is adapted so that, in operation, there is no current flow through the non-power region of the power plane and there is current flow through the power region of the power plane.

* * * * *